(12) United States Patent
Collins et al.

(10) Patent No.: US 7,897,410 B2
(45) Date of Patent: Mar. 1, 2011

(54) CLOSE PROXIMITY SCANNING SURFACE CONTAMINATION ANALYZER

(75) Inventors: Sean M. Collins, Austin, TX (US); Jeffrey W. Ritchison, Plano, TX (US); Richard L. Guldi, Dallas, TX (US); Kelly J. Taylor, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 388 days.

(21) Appl. No.: 11/959,080

(22) Filed: Dec. 18, 2007

(65) Prior Publication Data
US 2009/0153856 A1 Jun. 18, 2009

(51) Int. Cl.
*G01N 33/00* (2006.01)
*G01N 27/00* (2006.01)

(52) U.S. Cl. ............... 436/183; 422/68.1; 422/82.01

(58) Field of Classification Search ............ 250/281; 436/180, 183
See application file for complete search history.

(56) References Cited

U.S. PATENT DOCUMENTS

| | | | |
|---|---|---|---|
| 6,321,588 B1 * | 11/2001 | Bowers et al. ......... 73/24.01 |
| 7,521,257 B2 * | 4/2009 | Adams et al. ......... 436/183 |
| 2005/0136548 A1 * | 6/2005 | McDevitt et al. ......... 436/180 |
| 2005/0170523 A1 * | 8/2005 | Darrach et al. ......... 436/174 |
| 2008/0058786 A1 * | 3/2008 | Boyden et al. ......... 606/13 |
| 2008/0219891 A1 * | 9/2008 | McDevitt et al. ......... 422/82.05 |

\* cited by examiner

*Primary Examiner*—Nikita Wells
*Assistant Examiner*—Johnnie L Smith
(74) *Attorney, Agent, or Firm*—Warren L. Franz; Wade J. Brady III; Frederick J. Telecky, Jr.

(57) ABSTRACT

Reducing chemical contaminants is increasingly important for maintaining competitive production costs during fabrication of electronic devices. There is currently no production floor capability for mapping chemical contaminants across an electronic device substrate on a routine basis. A scanning surface chemical analyzer for mapping the distributions of a variety of chemicals on substrates is disclosed. The analyzer includes an array of sensors, each of which detects a single chemical or narrow range of chemicals, a scanning mechanism to provide a mapping capability, an electrical signal analyzer to collect and analyze signals from the array of sensors and generate reports of chemical distributions, and an optical desorption mechanism to amplify detection. A preferred embodiment includes an array of miniature quadrupole mass spectrometers in the sensor array. Scanning modes include whole substrate mapping, region sampling, and spot sampling of known defect sites.

17 Claims, 4 Drawing Sheets

FIG. 2C
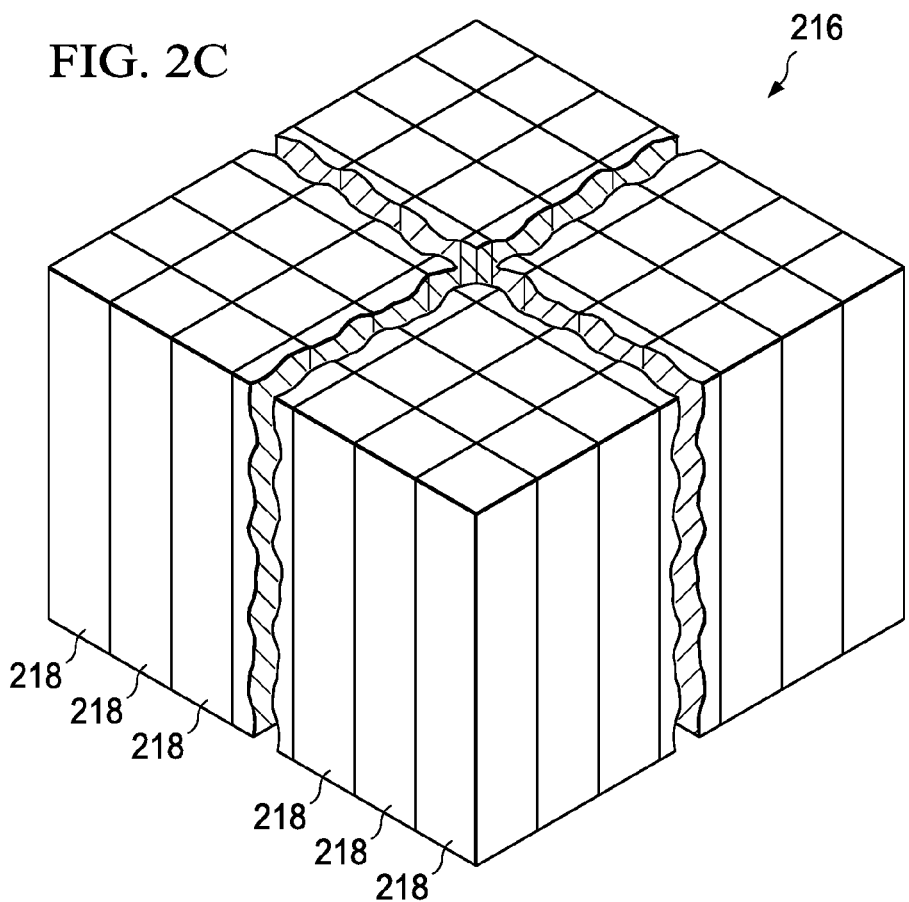
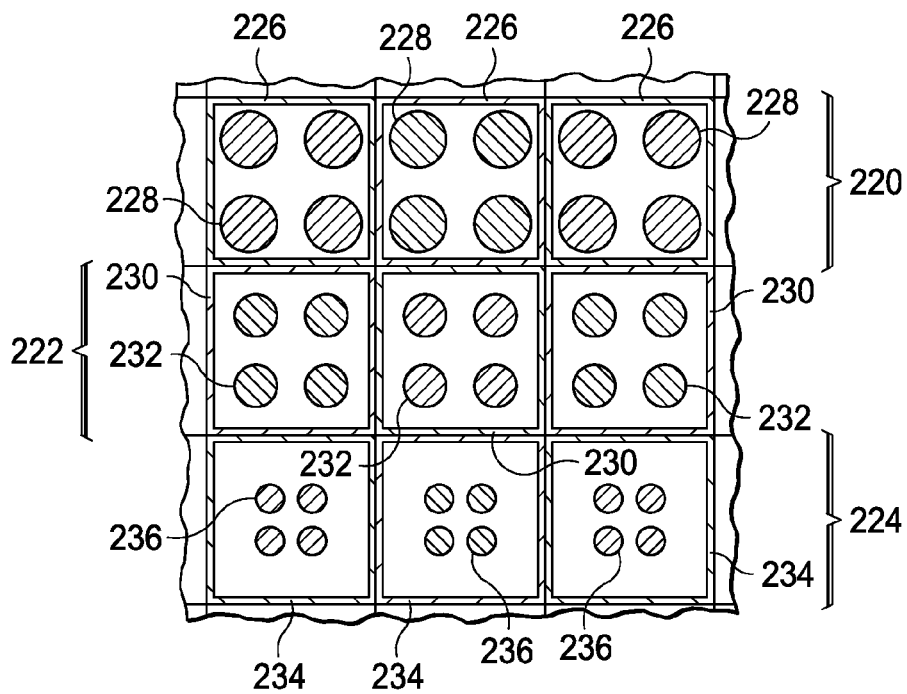
FIG. 2D

US 7,897,410 B2

CLOSE PROXIMITY SCANNING SURFACE CONTAMINATION ANALYZER

FIELD OF THE INVENTION

This invention relates to the field of electronic devices. More particularly, this invention relates to metrology tools used in electronic device fabrication.

BACKGROUND OF THE INVENTION

It is well known that components in electronic devices are shrinking in size with each new fabrication technology node, as articulated by Moore's Law. Maintaining competitive production yields of electronic devices requires elimination of increasingly smaller defects from a variety of sources, including smaller amounts of chemical contamination and defects with volatile chemicals. Identifying spatial distributions of chemical contaminants across an electronic device substrate provides valuable insight into the origins of the contaminants. No production capability exists to map chemical contaminations across an electronic device substrate.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention is a scanning surface chemical analyzer for mapping the distributions of a variety of chemicals on electronic device substrates. The analyzer includes an array of chemical sensors, which may be all of one type, or may include several types of sensors, a mechanism to scan the sensor array over a substrate, an electrical signal analyzer to collect and organize signals from the array of sensors to generate maps of chemical distributions, and an optional desorption mechanism to amplify or increase the flow of chemicals from the substrate surface into the sensor array. Operational modes include single pass scanning and multiple pass scanning while varying operating parameters of the sensors to provide a greater range of detected chemicals. Scanning modes include whole substrate mapping, region sampling, and spot sampling of known defect sites. In a preferred embodiment, the sensor array is an array of miniature quadrupole mass spectrometers. A method of mapping chemical distributions across a substrate is disclosed. A method of fabricating an electronic device using the inventive device is also disclosed.

DESCRIPTION OF THE VIEWS OF THE DRAWING

FIG. 2A through FIG. 2D are views of arrays of mass spectrometer quadrupoles in accordance with embodiments of the instant invention.

DETAILED DESCRIPTION

Figure 1:
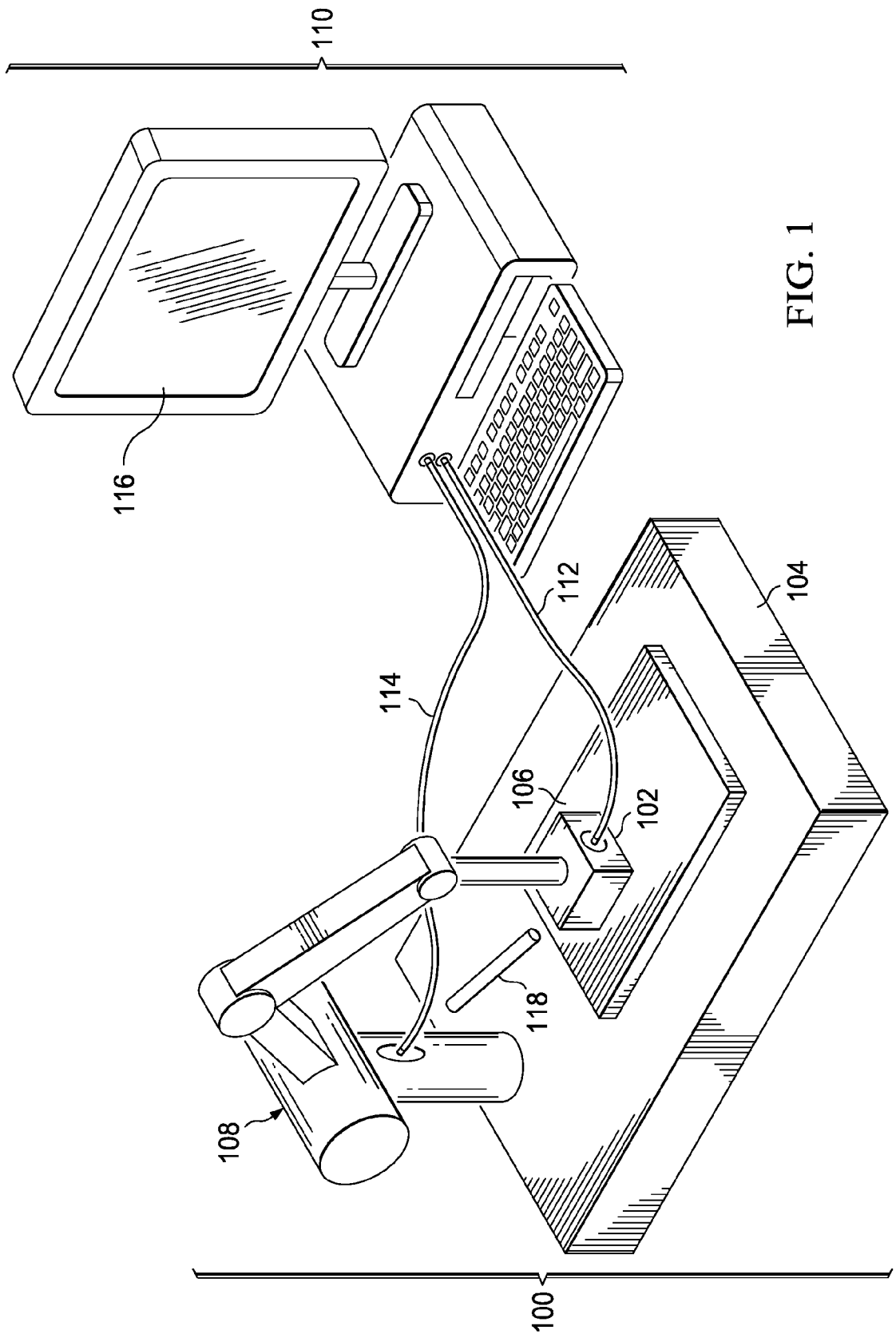
FIG. 1 is a perspective view of an electronic device substrate being scanned for chemicals by a mechanism according to an embodiment of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 is a perspective view of an electronic device substrate being scanned for chemicals by a mechanism according to an embodiment of the instant invention, which is a scanning surface chemical analyzer for scanning an electronic device substrate, detecting chemicals on the substrate surface and generating a map of the chemical distribution. The scanning surface chemical analyzer (100) includes an array (102) of chemical sensors, hereafter denoted as "sensor array," for detecting chemicals. The sensor array (102) has a set of individual chemical sensors, each of which detects a single chemical or a narrow range of similar chemicals, for example isomers of a molecule. Each sensor generates an electrical signal which contains information about the amount, and possibly the type, of chemical detected. The sensors in the sensor array may be quadrupole mass spectrometers, time-of-flight mass spectrometers, gas chromatographs, infrared spectrometers, fluorescence spectrometers, or a combination of these types of sensors. The scanning surface chemical analyzer (100) also includes a substrate platform (104) which holds an electronic device substrate (106), hereafter denoted as substrate, during a scan operation. The substrate may be a semiconductor wafer containing integrated circuits, a printed circuit board, a glass panel containing visual display elements such as thin film transistors, a ceramic plate holding active and passive electronic components, a sheet containing microelectronic and mechanical systems (MEMS) components, or other substantially flat element containing electronic devices. A scanning mechanism (108) positions the sensor array (102) close enough to the substrate (106) that the sensors in the sensor array (102) can detect chemicals from a top surface of the substrate (106), and moves the sensor array (102) and the substrate (106) relative to each other so that every sensor in the sensor array (102) may sample any region of the substrate (106). FIG. 1 depicts an embodiment of a configuration for a scanning mechanism in which the sensor array is moved while the substrate is held fixed in place. In another embodiment, the substrate may be moved relative to a stationary sensor array. In another embodiment, both sensor array and substrate may move relative to the platform. As each sensor in the sensor array (102) detects chemicals from the top surface of the substrate (106), electrical signals from the sensors are transmitted to an electrical signal analyzer (110), for example through a first electrical cable (112). The electrical signal analyzer (110) may comprise components for converting electrical signals from one form to another, for example from analog voltages to digital numbers, and components for performing manipulations on electrical signals, for example a computer, including a standalone computer or a networked computer. The electrical signal analyzer (110) and the scanning mechanism (108) communicate with each other, for example through a second electrical cable (114), so that the electrical signals from the sensors in the sensor array (102) may be placed in correspondence by the electrical signal analyzer (110) with the relative position of each sensor with respect to the substrate (106) during the scanning operation. The electrical signal analyzer (110) generates information on the distribution of each chemical on the substrate (106), which may take the form of a graphical map (116), tabular compilation, or other format. In one mode of generating information on the distribution of chemicals, signals from a site on the substrate may be compared with signals from similar sites on the substrate, for example, from adjacent integrated circuits on a semiconductor wafer, to identify sites with anomalous chemical distributions. In another mode, signals from a site on the substrate may be compared with signals from a reference substrate known to be good. The information may also be used to identify sites on a substrate for further analysis by other means, such as optical microscopy or scanning electron microscopy. The information from the electrical signal analyzer (110) on the distribution of each chemical may be used to identify sources of contamination and defects as an aid to reducing contamination and defects on electronic device substrates. Workers in the field of electronic device fabrication will recognize the benefit of information on the distribution of chemicals on substrate surfaces and its utility in reducing contamination and defects on electronic device substrates.

The scanning surface chemical analyzer (100) may also include a desorption mechanism (118) which induces chemicals adhering to the substrate surface to enter the sensor array where they may be detected. The desorption mechanism may operate by heating a region of the substrate surface, which may be accomplished by irradiation with a laser beam, irradiation by a radiant heat source such as a heat lamp, thermal conduction from an electrical heat source, thermal conduction from a plasma, or other means. The desorption mechanism may also operate by supplying photons from an ultraviolet or X-ray source to a region on the substrate surface.

The sensor array may exist in several embodiments. In one embodiment, sufficient individual sensors may be configured in the sensor array to detect every chemical of interest during one scan of the sensor array functioning at one set of operating parameters. In another embodiment, a first subset of the chemicals of interest may be detectable while operating the sensor array in a first mode, and a second subset of the chemicals of interest may be detectable while operating the sensor array in a second mode. In such an embodiment, the sensor array may be scanned over the substrate surface twice, firstly while operating in the first mode, and secondly while operating in the second mode, to detect the chemicals in the first and second subsets. This embodiment may be extended to detect more subsets of the chemicals of interest. Alternately, the sensor array may be positioned at a first location over the substrate and cycled through a plurality of operating modes, then moved to a second location and cycled through the same plurality of operating modes, and so on, to cover the region of interest on the substrate.

The scanning operation may be accomplished in various modes. In one embodiment, the entire surface of the substrate may be scanned to generate information on the chemical distributions over the entire surface. In another embodiment, regions on the substrate surface may be scanned, for example a center region or a quadrant of the substrate surface may be scanned. In another embodiment, a plurality of regions with known defects, known anomalies or known special sensitivities may be spot sampled.

Each sensor in a sensor array may have a sample port which is smaller than a sensor cross-sectional area, which limits a sampling area on a substrate to a smaller region than the sensor cross-sectional area. In this embodiment, a chemical distribution with higher spatial resolution may be obtained.

Figure 2A:
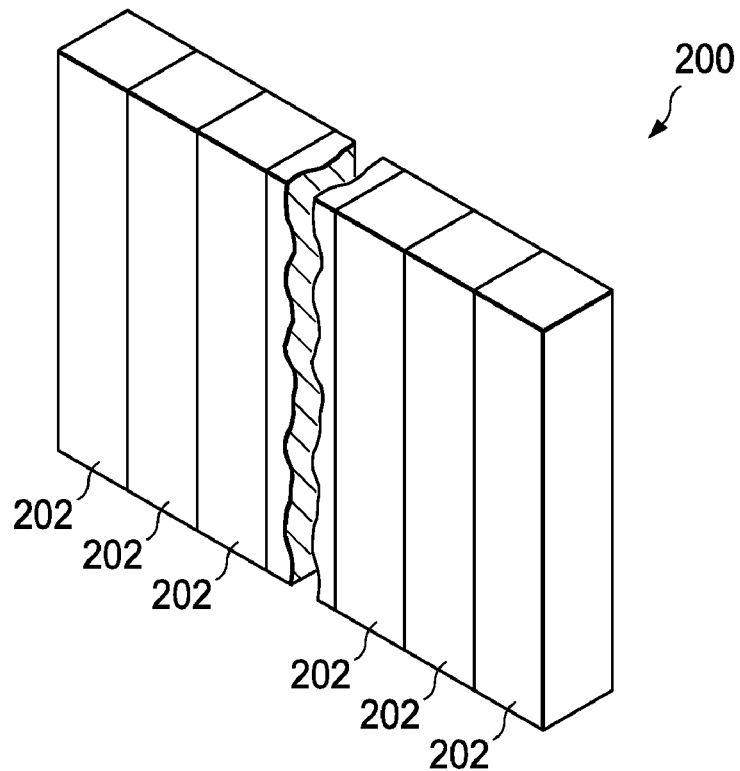

FIG. 2A through FIG. 2D are views of arrays of mass spectrometer quadrupoles, hereafter denoted as quadrupoles, in accordance with embodiments of the instant invention. Referring to FIG. 2A, a linear sensor array (200) which includes a plurality of quadrupoles (202) forms the sensor array for a scanning surface chemical analyzer. The quadrupoles (202) may be fabricated by conventional methods, or may be fabricated by alternate methods, for example, by MEMS fabrication techniques. The chemicals of interest are made of molecules, which may be detected by the mass spectrometers in the linear sensor array (200). Each quadrupole is capable of detecting molecules in a different range of mass, for example, a first quadrupole may detect molecules with masses from 75 to 76 atomic mass units, also known as daltons, and a second quadrupole may detect molecules with masses from 76 to 77 daltons. In one embodiment, the linear sensor array (200) may include sufficient quadrupoles (202) to detect every chemical of interest during one scan of the linear sensor array while functioning at one set of operating parameters. In another embodiment, a first subset of the chemicals of interest may be detectable while operating the linear sensor array (200) in a first mode, for example by applying a first set of voltages and frequencies to the quadrupoles (202), and a second subset of the chemicals of interest may be detectable while operating the linear sensor array (200) in a second mode, for example by applying a second set of voltages and frequencies to the quadrupoles (202). In such an embodiment, the linear sensor array (200) may be scanned over the substrate surface twice, firstly while operating in the first mode, and secondly while operating in the second mode, to detect the chemicals in the first and second subsets. This embodiment may be extended to detect more subsets of the chemicals of interest. Alternately, the linear sensor array (200) may be positioned at a first location over the substrate and cycled through a plurality of operating modes, then moved to a second location and cycled through the same plurality of operating modes, and so on, to cover the region of interest on the substrate.

Figure 2B:
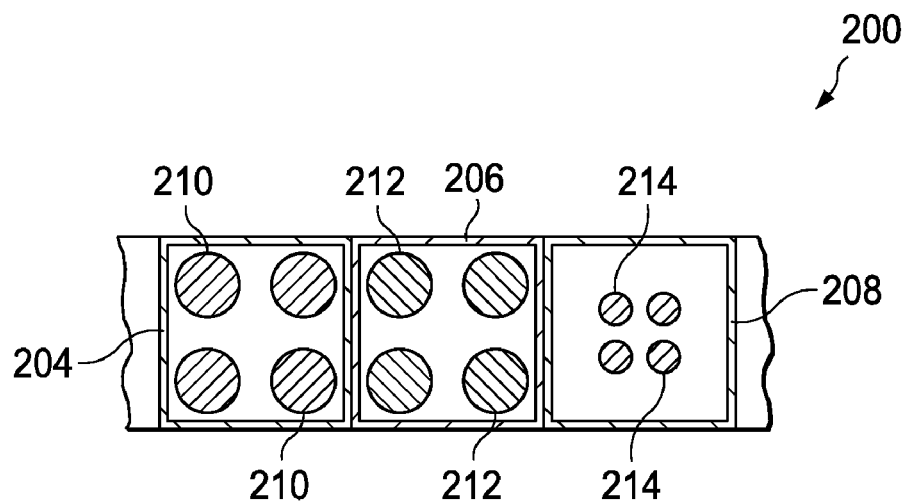

FIG. 2B depicts an end view of an embodiment in which a linear sensor array (200) includes quadrupoles of different sizes. A first quadrupole (204) includes a first set of electrodes (210). A second quadrupole (206) includes a second set of electrodes (212) of a same radius as the first set of electrodes (210). The second quadrupole (206) may be operated at a different frequency and set of electrode voltages than the first quadrupole (204) and thus detect molecules in a different mass range from those detected by the first quadrupole (204). A third quadrupole (208) includes a third set of electrodes (214) which have a smaller radius than the first and second sets of electrodes (210, 212). The third quadrupole (208) may be operated at a same frequency and set of electrode voltages as the second quadrupole, and detect molecules with larger masses than those detected by the second quadrupole, because of its smaller electrode radius.

A quadrupole mass spectrometer includes an ion detector, which converts an impact of a molecule to an electrical signal. In one embodiment of a linear sensor array, each quadrupole in the linear sensor array may have a separate ion detector. Such an embodiment allows detection of molecules from each quadrupole 100% of the time each quadrupole is operating. In another embodiment, a plurality of quadrupoles in a linear sensor array share an ion detector, in a multiplexing arrangement.

Referring to FIG. 2C, an areal, or two-dimensional, sensor array (216) includes a plurality of quadrupoles (218) forms the sensor array for a scanning surface chemical analyzer. Each quadrupole is capable of detecting molecules in a different range of mass, for example, a first quadrupole may detect molecules with masses from 75 to 76 atomic mass units, also known as daltons, and a second quadrupole may detect molecules with masses from 76 to 77 daltons. In one embodiment, the areal sensor array (216) may include sufficient quadrupoles (218) to detect every chemical of interest during one scan of the areal sensor array while functioning at one set of operating parameters. In another embodiment, a first subset of the chemicals of interest may be detectable while operating the areal sensor array (216) in a first mode, for example by applying a first set of voltages and frequencies to the quadrupoles (218), and a second subset of the chemicals of interest may be detectable while operating the areal sensor array (216) in a second mode, for example by applying a second set of voltages and frequencies to the quadrupoles (218). In such an embodiment, the areal sensor array (216) may be scanned over the substrate surface twice, firstly while operating in the first mode, and secondly while operating in the second mode, to detect the chemicals in the first and second subsets. This embodiment may be extended to detect more subsets of the chemicals of interest. Alternately, the areal sensor array (216) may be positioned at a first location over the substrate and cycled through a plurality of operating modes, then moved to a second location and cycled through the same plurality of operating modes, and so on, to cover the region of interest on the substrate.

FIG. 2D depicts an end view of an embodiment in which an areal sensor array (216) includes quadrupoles of different sizes. In the instant embodiment, a first row (220) includes quadrupoles (226) with electrodes (228) of a first radius. A second row (222) includes quadrupoles (230) with electrodes (232) of a second radius, which is smaller than the first radius. A third row (224) includes quadrupoles (234) with electrodes (236) of a third radius, which is smaller than the second radius. A quadrupole in the first row (220), a quadrupole in the second row (222) and a quadrupole in the third row (224) may be operated at a same frequency and set of electrode voltages, and detect molecules with different mass ranges, because of their different electrode radii.

Figure 3A:
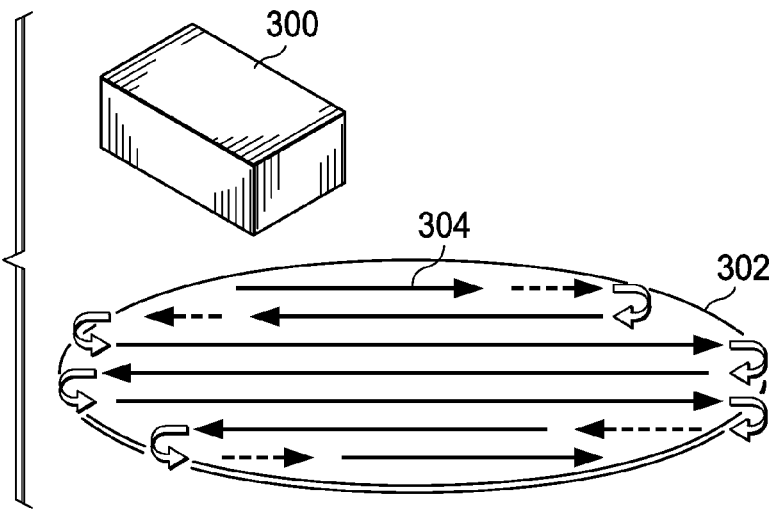
FIG. 3A thru FIG. 3C are perspective views depicting modes of scanning an electronic device substrate for chemicals according to embodiments of the instant invention.
Figure 3B:
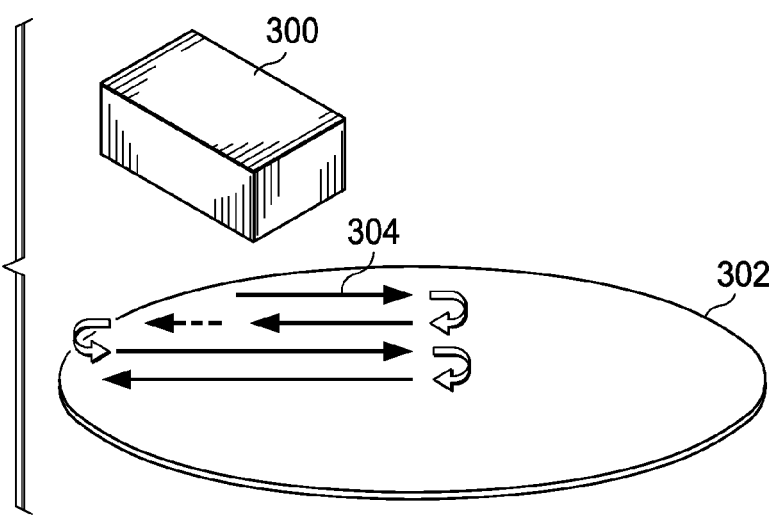
Figure 3C:
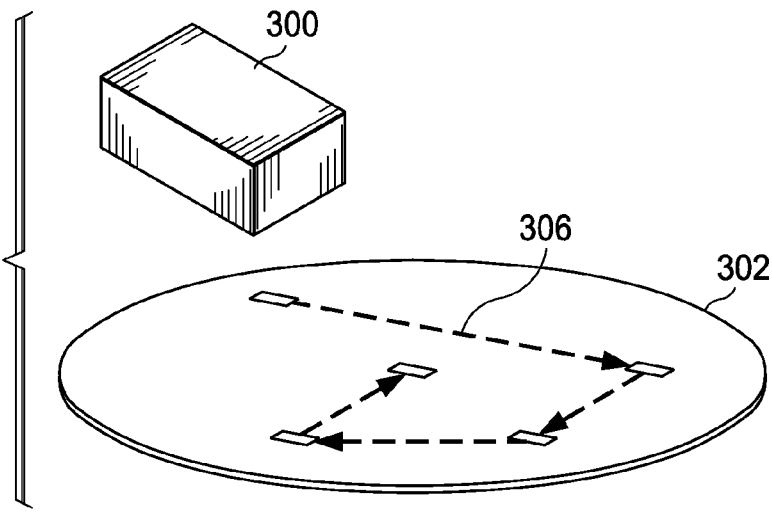

FIG. 3A thru FIG. 3C are perspective views depicting modes of scanning an electronic device substrate for chemicals according to embodiments of the instant invention. FIG. 3A depicts a sensor array (300) over a substrate (302), being scanned in a manner which will cover an entire top surface of the substrate (302). Scan arrows (304), arranged in a linear array of straight scans across the substrate, depict the relative motion of the sensor array (300) with respect to the substrate (302). It will be recognized by practitioners of electronic device fabrication that there are other scan modes which will also accomplish the goal of scanning the entire top surface of the substrate (302).

FIG. 3B depicts a sensor array (300) over a substrate (302), being scanned in a manner which will cover one quadrant of the top surface of the substrate (302). Scan arrows (304), arranged in a linear array of straight scans halfway across the substrate, depict the relative motion of the sensor array (300) with respect to the substrate (302). In other embodiments, the region scanned may be the center region of the substrate, an outer annulus of the substrate, or a checkerboard pattern covering the entire top surface of the substrate. It will be recognized by practitioners of electronic device fabrication that for each region to be scanned, a plurality of scan patterns exist which will accomplish the scan objectives.

FIG. 3C depicts a sensor array (300) over a substrate (302), being spot sampled in a manner which will detect chemicals in a plurality of regions on the top surface of the substrate (302). Traversement arrows (306) indicate direct movement from one site to another without detecting surface chemicals during the movement. Such an embodiment might be used to generate chemical distributions in a set of sites with known defects.

What is claimed is:

1. A scanning surface chemical analyzer for measuring spatial distributions of chemicals on a surface of an electronic device substrate, comprising:
    an array of quadrupole mass spectrometer sensors, in which each sensor is dimensioned and configured to detect a different chemical and output an electrical signal upon detection of the different chemical;
    a mechanical scanning mechanism configured to move the array of sensors relative to the substrate surface so that every sensor in the sensor array may sample a same region of the surface for detection of the respective different chemicals; and
    an electrical signal analyzer configured to collect and analyze the electrical signals output from the respective sensors and to generate a report of spatial distributions of detected ones of the different chemicals on the surface.

2. The scanning surface chemical analyzer of claim 1, further comprising a desorbing mechanism for desorbing chemicals from the surface into the sensor array.

3. The scanning surface chemical analyzer of claim 1, in which a plurality of sets of electrodes of the quadrupole mass spectrometer sensors is multiplexed to a common ion detector.

4. A method for measuring spatial distributions of chemical species on a surface of an electronic device substrate, comprising the steps of:
    providing an array of quadrupole mass spectrometer sensors dimensioned and configured for respectively detecting different chemicals, in which each sensor detects the different chemical and outputs an electrical signal upon detection of the different chemical;
    moving the array of sensors relative to the substrate so that every sensor in the sensor array samples a same region of the surface for detecting the respective different chemicals and outputting the electrical signals; and
    collecting and analyzing the electrical signals by an electrical signal analyzer and generating a report of spatial distributions of detected ones of the different chemicals on the surface.

5. The method of claim 4, further comprising desorbing chemicals from the surface using a desorbing mechanism while the sensor array is detecting chemicals.

6. The method of claim 4, in which a plurality of sets of electrodes of the quadrupole mass spectrometer sensors is multiplexed to a common ion detector.

7. The method of claim 4, further comprising the steps of:
    changing a detecting mode in the array of quadrupole mass spectrometer sensors;
    moving the array of sensors relative to the substrate relative with the array operating in the changed detecting mode for detecting a second plurality of chemicals and outputting a second set of electrical signals; and collecting and analyzing the second set of electrical signals and generating a report of spatial distributions of detected ones of the second plurality of chemicals on the surface.

8. The method of claim 4, in which the step of moving the array of sensors relative to the substrate enables the array of sensors to detect chemicals from predetermined regions of the surface.

9. The method of claim 8, in which the predetermined regions are sites of known defects.

10. A method of fabricating an electronic device, comprising steps of:
providing an array of quadrupole mass spectrometer sensors dimensioned and configured for respectively detecting different chemicals, in which each sensor detects the different chemical and outputs an electrical signal upon detection of the different chemical;
moving the array of sensors relative to the substrate so that every sensor in the sensor array samples a same region of the surface for detecting the respective different chemicals and outputting the electrical signals;
collecting and analyzing the electrical signals by an electrical signal analyzer and generating a report of spatial distributions of detected ones of the different chemicals on the surface; and
using the report of spatial distributions to reduce chemical contaminations on a second substrate.

11. The method of claim 10, further comprising desorbing chemicals from the surface using a desorbing mechanism while the sensor array is detecting chemicals.

12. The method of claim 10, in which a plurality of sets of electrodes of the quadrupole mass spectrometer sensors are multiplexed to a common ion detector.

13. The method of claim 10, further comprising the steps of:
changing a detecting mode in the array of quadrupole mass spectrometer sensors;
moving the array of sensors relative to the substrate with the array operating in the changed detecting mode for detecting a second plurality of chemicals and outputting a second set of electrical signals; and
collecting and analyzing the second set of electrical signals and generating a report of spatial distributions of detected ones of the second plurality of chemicals on the surface.

14. The method of claim 10, in which the step of moving the array of sensors relative to the substrate enables the array of sensors to detect chemicals from predetermined regions of the surface.

15. The method of claim 14, in which the predetermined regions are sites of known defects.

16. The scanning surface chemical analyzer of claim 1, wherein the different chemicals detected are determined by respective different radii of sets of electrodes of the respective quadrupole mass spectrometer sensors.

17. The method of claim 4, wherein the different chemicals detected are determined by respective different radii of sets of electrodes of the respective quadrupole mass spectrometer sensors.

* * * * *